(12) United States Patent
Gambino et al.

(10) Patent No.: US 9,059,180 B2
(45) Date of Patent: Jun. 16, 2015

(54) THICK BOND PAD FOR CHIP WITH CAVITY PACKAGE

(71) Applicant: International Business Machines Corporation, Armonk, NY (US)

(72) Inventors: Jeffrey P. Gambino, Westford, VT (US); Robert K. Leidy, Burlington, VT (US); Richard J. Rassel, Stowe, VT (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 13/737,611

(22) Filed: Jan. 9, 2013

(65) Prior Publication Data

US 2013/0127035 A1 May 23, 2013

Related U.S. Application Data

(62) Division of application No. 12/564,996, filed on Sep. 23, 2009, now Pat. No. 8,450,822.

(51) Int. Cl.
*H01L 31/0232* (2014.01)
*H01L 23/538* (2006.01)
*H01L 31/0203* (2014.01)
*H01L 21/768* (2006.01)

(52) U.S. Cl.
CPC ........ *H01L 23/5384* (2013.01); *H01L 31/0203* (2013.01); *H01L 21/76877* (2013.01); *H01L 2924/0002* (2013.01)

(58) Field of Classification Search
CPC ................... H01L 27/14621; H01L 27/14627; H01L 27/14636; H01L 21/76849
USPC ............. 257/432, 448, 434, E31.127, E21.04
See application file for complete search history.

(56) References Cited

U.S. PATENT DOCUMENTS

| 5,635,424 | A  | 6/1997 | Rostoker et al. |
| 6,060,378 | A  | 5/2000 | Rolfson |
| 6,077,766 | A  | 6/2000 | Sebesta et al. |
| 6,583,019 | B2 | 6/2003 | Vandermeulen et al. |
| 6,734,570 | B1 | 5/2004 | Archer |
| 7,074,721 | B2 | 7/2006 | Wang |

(Continued)

FOREIGN PATENT DOCUMENTS

JP 60117648 6/1985

OTHER PUBLICATIONS

Lam, Cathy N., Office Action, U.S. Appl. No. 12/564,996 dated Jun. 11, 2011, 10 pgs.

(Continued)

*Primary Examiner* — Cathy N Lam
(74) *Attorney, Agent, or Firm* — David Cain; Hoffman Warnick LLC

(57) ABSTRACT

Disclosed herein an image sensor chip, including a substrate having at least one via extending through at least one inter layer dielectric (ILD); a first conductive layer over the ILD, wherein the first conductive layer has a first thickness; a second conductive layer over the first conductive layer, wherein the second conductive layer has a second thickness of less than the first thickness; a polymer layer over the second conductive layer, the polymer layer including a cavity; a plurality of cavity components in the cavity; and protective layer contacting the polymer layer and covering the cavity.

5 Claims, 10 Drawing Sheets

(56) References Cited

U.S. PATENT DOCUMENTS

| | | |
|---|---|---|
| 7,179,670 B2 | 2/2007 | Shelton et al. |
| 7,361,989 B1 | 4/2008 | Adkisson et al. |
| 7,521,798 B2 | 4/2009 | Adkisson et al. |
| 2003/0096493 A1 | 5/2003 | Vandermeulen et al. |
| 2006/0030083 A1 | 2/2006 | Wu |
| 2006/0110905 A1 | 5/2006 | Adkisson et al. |
| 2008/0054388 A1* | 3/2008 | Nakata et al. ............ 257/432 |
| 2008/0224246 A1* | 9/2008 | Lee ............................ 257/432 |
| 2009/0151989 A1 | 6/2009 | Hunrath |

OTHER PUBLICATIONS

Lam, Cathy N., Final Office Action, U.S. Appl. No. 12/564,996 dated Oct. 25, 2011, 9 pgs.

Lam, Cathy N., Notice of Allowance and Fee(s) Due, U.S. Appl. No. 12/564,996 dated Nov. 26, 2012, 9 pgs.

* cited by examiner

THICK BOND PAD FOR CHIP WITH CAVITY PACKAGE

CROSS REFERENCE TO RELATED APPLICATIONS

This application is a divisional application of co-pending U.S. patent application Ser. No. 12/564,996, filed on Sep. 23, 2009, which is hereby incorporated herein.

FIELD OF THE INVENTION

This invention relates generally to chips with a cavity package and more particularly to a thick bond pad for chips with a cavity package.

BACKGROUND

Chips with cavity packages have a similar structure to a conventional chip with the exception that a portion of the lid or cover glass of the package is offset from the surface of the chip, forming a cavity. A common application for chips with cavity packages is for image sensor chips commonly used in such devices as cell phones. The cavity of image sensor chips contains components including micro lenses, color filters, and sensors in the cavity. In the case of an image sensor chip, a glass layer is placed over the front side of the image sensor chip, with a polymer spacer between the glass and the image sensor chip, around the perimeter of the array. Note that the polymer spacer is absent from the array. This structure protects the components placed in the cavity while simultaneously allowing light to reach the components.

Referring to FIG. 1, the polymer layer 14 that forms the cavity 16 prevents connective wiring (i.e. such as a wire bond) access to the top wiring layer 12. Referring to FIG. 2, in order to access the top wiring layer 12, after the chip is diced, package leads 26 are placed along the side of the chip that make lateral connections with the top wiring layers 12. A bond pad 28 is the area of connection of the top wiring layer 12 and the package lead 26. The bond pad 28, via the package lead 26, connects the image sensor chip 2 to other circuits in the camera.

The top wiring layer is preferably thin—approximately less than one (1.0) micron. Thin top wiring layers maximize the image sensor chip's sensitivity to light. At the same time, the lateral connections formed between the package leads on the side of the chip and the thin top wiring layers create connections with high resistance due to the small cross-sectional area of the thin top wiring layers and the package leads. Therefore, there is a conflict in the requirements of the thickness of the top wiring layer. On the one hand, thick top wiring layers result in thick bond pads, of approximately one (1.0) micron or more, permitting better package lead connections with lower resistance, while on the other hand, thin top wiring layers, of approximately less than one (1.0) micron, permit finely spaced and narrow wires.

BRIEF SUMMARY

A first aspect of the disclosure provides an image sensor chip, comprising a substrate having at least one via extending through at least one inter layer dielectric (ILD); a first conductive layer over the ILD, wherein the first conductive layer has a first thickness; a second conductive layer over the first conductive layer, wherein the second conductive layer has a second thickness of less than the first thickness; a polymer layer over the second conductive layer, the polymer layer including a cavity; a plurality of cavity components in the cavity; and an optically transparent layer contacting the polymer layer and covering the cavity.

A second aspect of the disclosure provides chip with a cavity package, comprising: a substrate having at least one via extending through at least one inter layer dielectric (ILD); a first conductive layer over the ILD, wherein the first conductive layer has a first thickness; a second conductive layer over the first conductive layer, wherein the second conductive layer has a second thickness of less than the first thickness; a polymer layer over the second conductive layer, the polymer layer including a cavity; and a protective layer contacting the polymer layer and covering the cavity.

A third aspect of the disclosure provides a method, the method comprising: depositing a silicon nitride layer over an inter layer dielectric (ILD); depositing a first conductive layer having a first thickness; forming a mask over a first portion of the first conductive layer to expose a second portion of the first conductive layer; etching the first conductive layer; etching the silicon nitride layer with a fluorine-based etch; and depositing a second conductive layer having a second thickness.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Figure 1:
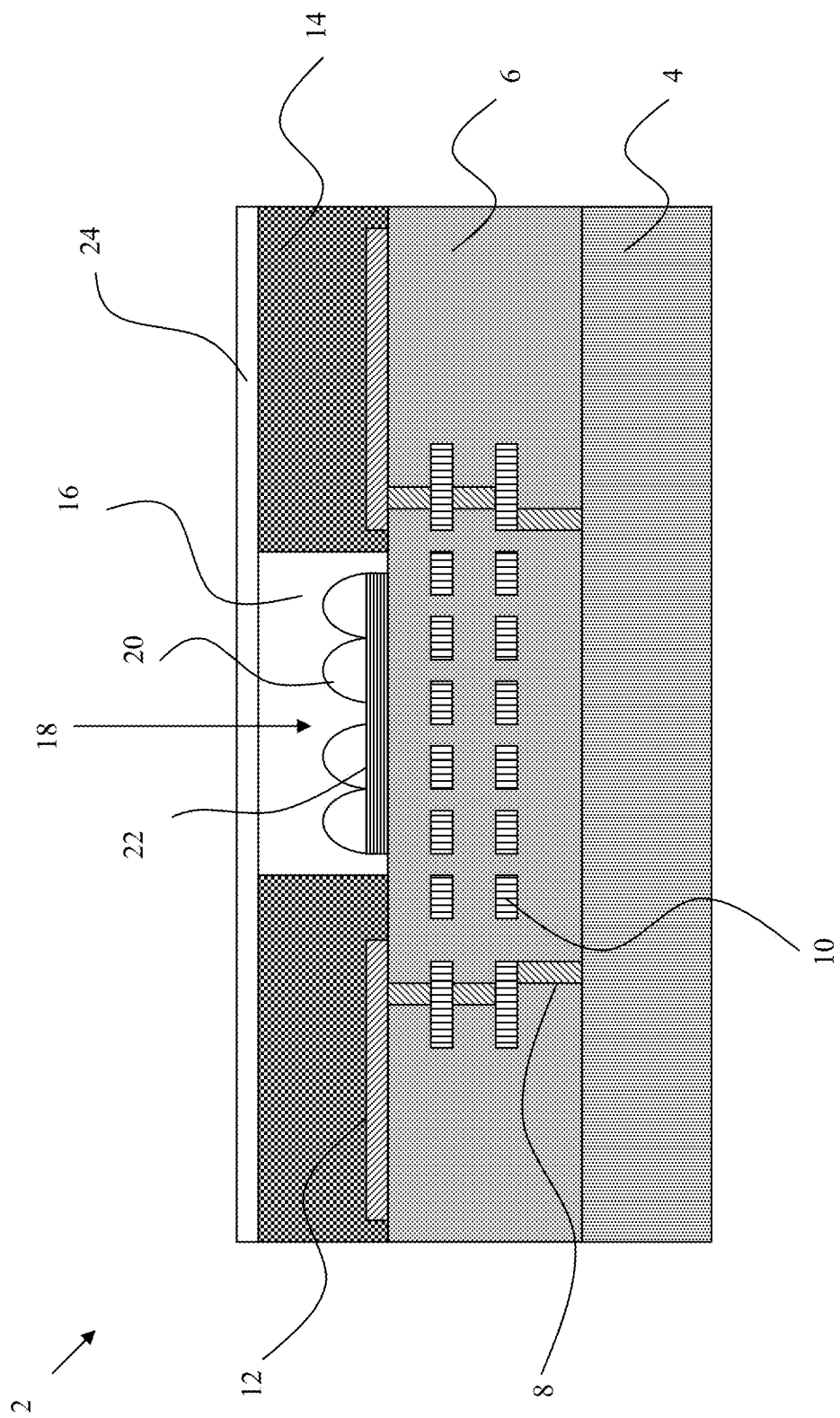
FIG. 1 shows a cross-section view of a known image sensor chip prior to dicing.

Referring to FIG. 1, a cross-section view of a known image sensor chip 2 prior to dicing is shown. Image sensor chip 2 includes a substrate 4, an inter layer dielectric (ILD) 6 over substrate 4, a plurality of vias 8 through ILD 6, a plurality of internal wiring layers 10 stacked within ILD 6, a conductive layer 12 over ILD 6 and connecting to plurality of vias 8, a polymer layer 14 over conductive layer 12, a cavity 16 formed within polymer layer 14, a plurality of cavity components 18 (e.g., micro lenses and color filters 20 connected to a sensor 22), and a glass layer 24 contacting polymer layer 14 and covering cavity 16.

Figure 2:
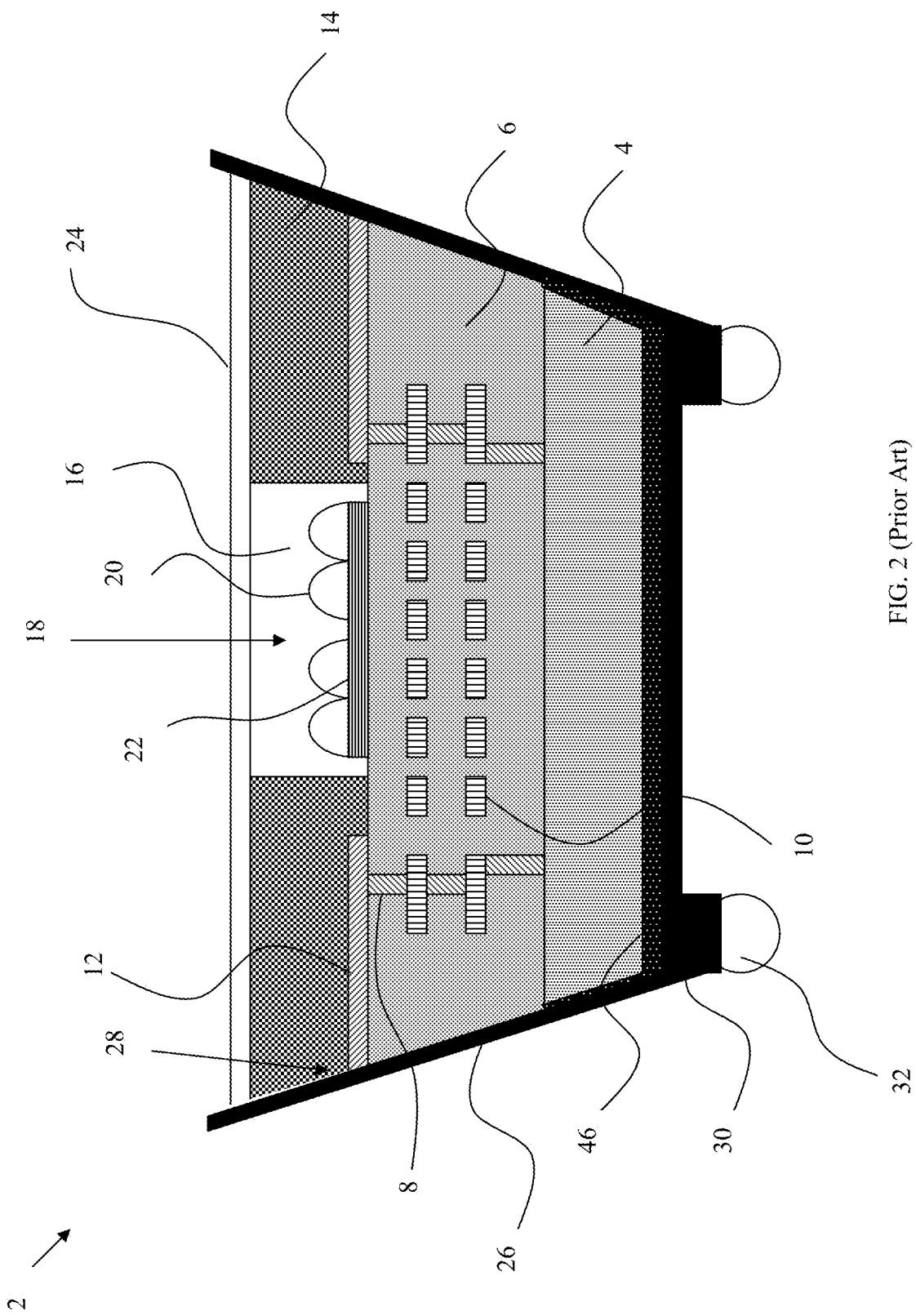
FIG. 2 shows a cross-section view of a known image sensor chip after dicing.

Referring to FIG. 2, a cross-section view of a known image sensor chip 2 after dicing is shown. Dicing creates slanted sides. Polymer layer 14 prevents connective wiring access to conductive layer 12. In order to provide connective wiring access to conductive layer 12, after dicing, image sensor chip 2 includes a plurality of package leads 26 along the side of the image sensor chip 2 forming lateral connections with conductive layer 12. Image sensor chip 2 may include an insulator 40 between package leads 26 and substrate 4 providing electrical isolation from the substrate 2. Insulator 46 may include silicon oxide ($SiO_2$), silicon nitride (SiN), or any other suitable material. A plurality of bond pads 28 form lateral connections in areas where the conductive layers 12 and package leads 26 contact. Package leads 26 run under image sensor chip 2 to a plurality of bump pads 30. A plurality of solder balls 32 are connected to plurality of bump pads 30.

Figure 3:
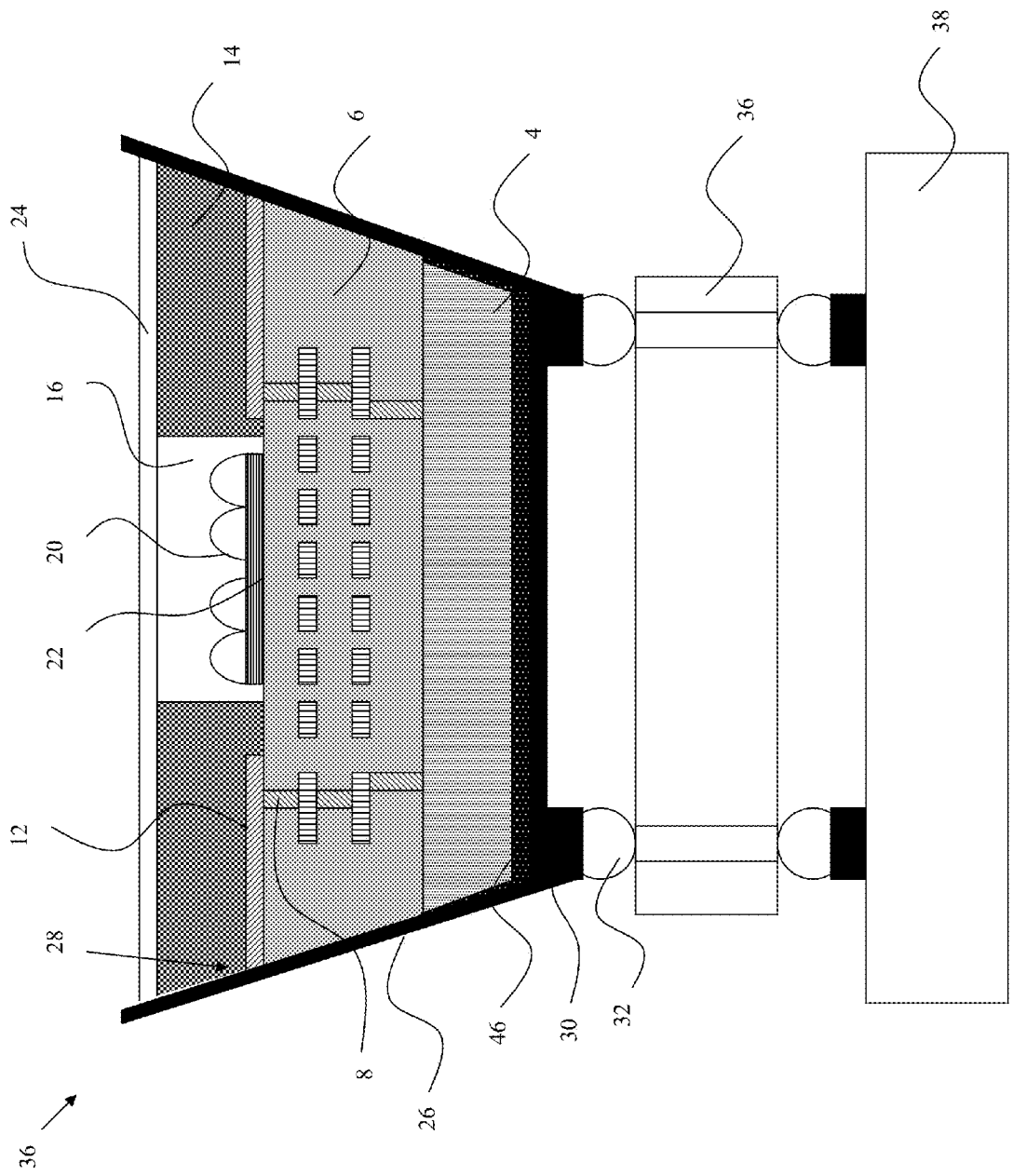
FIG. 3 shows a cross-section view of a known chip scale package.

Referring to FIG. 3, a known chip scale package 34 is shown. Chip scale package 34 comprises image sensor chip 2, a logic chip 36 and a carrier package 38. Bond pads 28 connect conductive layer 12 with package leads 28. Package leads 26 via the bump pads 30 and solder balls 32 connect image sensor chip 2 to logic chip 36. Logic chip 36 is connected to carrier package 38.

Figure 4:
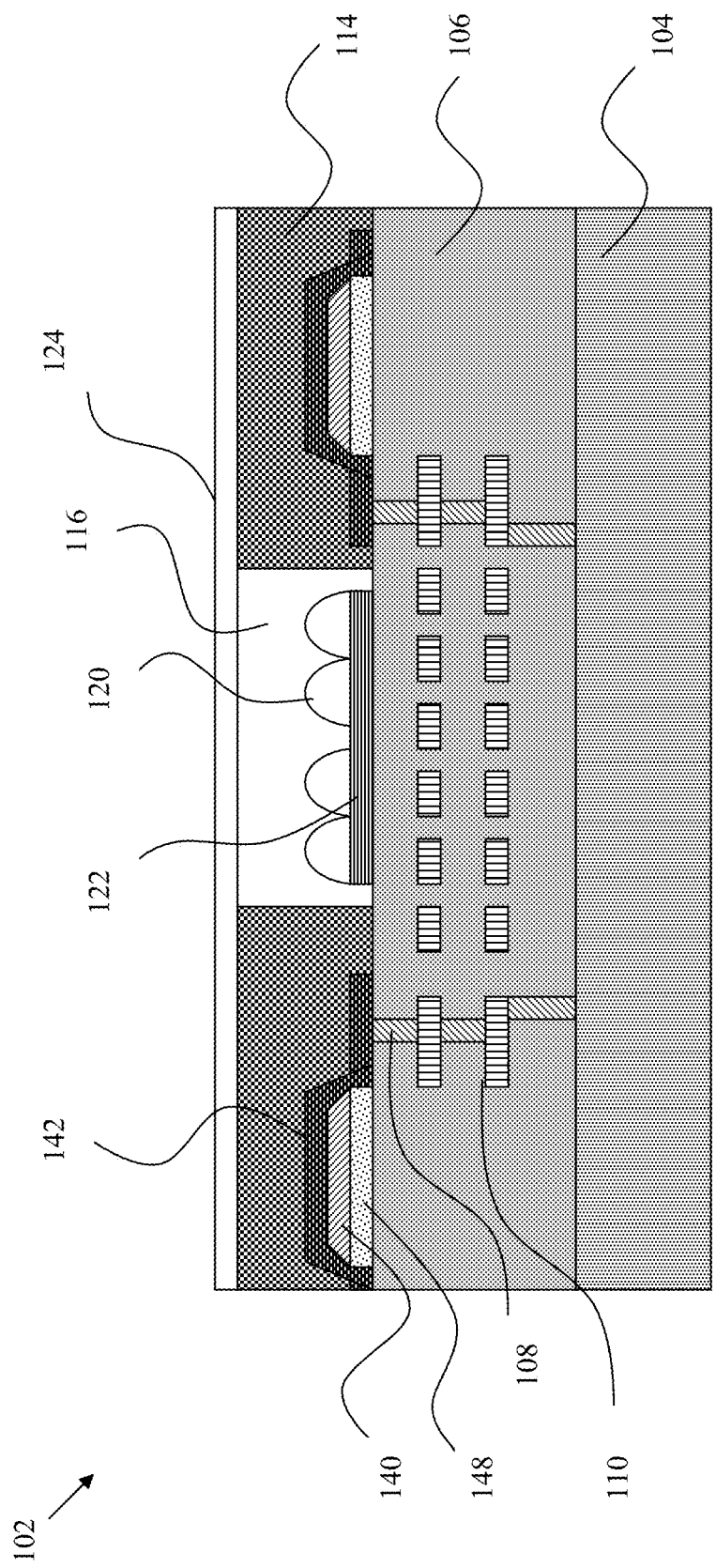
FIG. 4 shows a cross-section view of one embodiment of an image sensor chip before dicing according to the invention.

Referring to FIG. 4, a cross sectional view of one embodiment of an image sensor chip 102 before dicing in accordance with this invention is shown. While an image sensor chip 102 is illustrated, the teachings of the invention can be applicable to any chip with a cavity package such as for use in a Micro-Electro-Mechanical Systems (MEMS). This embodiment includes a substrate 104. Substrate 104 may be comprised of but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 104 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 104, as illustrated and described, are well known in the art and thus, no further description is necessary. Transistors and other now known or later developed devices may be included in the substrate 104. In one embodiment, substrate 104 of image sensor chip 102 may include a photodiode. Transistors and photodiodes are well known in the art and thus, no further description is necessary.

Image sensor chip 102 may include at least one inter layer dielectric (ILD) 106 over substrate 104. Any number of dielectric layers may be located over the chip body, as may other layers included in semiconductor chips now known or later developed. In one embodiment, ILD 106 may include silicon oxide ($SiO_2$) for its insulating, mechanical and optical qualities. ILD 106 may include but are not limited to: silicon nitride ($Si_3N_4$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available form JSR Corporation, other low dielectric constant (<3.9) material, or layers thereof. Inter-level dielectric layer 130 may be deposited using conventional techniques described herein and/or those known in the art.

As used herein, the term "deposition" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

One embodiment of image sensor chip 102 includes at least one via 108 through ILD 106. In one embodiment, at least one via 108 may include tungsten. At least one via 108 may also include copper, aluminum, gold, silicides, or any other now known or later developed suitable materials. A plurality of internal wiring layers 110 may be included in ILD 106. The internal wiring layers 110 may be comprised of copper or any other suitable material.

One embodiment of image sensor chip 102 includes a first conductive layer 140 positioned over ILD 106. First conductive layer 140 has a first thickness. For example, first thickness may be approximately 1.0 microns or greater. First conductive layer 140 may have a tapered profile.

Continuing with FIG. 4, one embodiment of image sensor chip 102 includes a second conductive layer 142 positioned over first conductive layer 140. Second conductive layer 142 has a second thickness of less than the first thickness. In one embodiment, second conductive layer 142 includes aluminum. For example, second thickness may be approximately less than 1.0 microns. Second conductive layer 142 may also include gold or copper. In embodiments where first conductive layer 140 and second conductive layer 142 do not include the same material, an electrically conducting diffusion barrier (not shown) of titanium nitride, tantalum nitride, tungsten, or any other suitable material may be included between first conductive layer 140 and second conductive layer 142. Second conductive layer 142 forms a connection with at least one via 108 and first conductive layer 140. Second conductive layer 142 substantially conforms to the profile of the first conductive layer 140. In one embodiment, second conductive layer 142 may completely cover first conductive layer 140.

One embodiment of image sensor chip 102 includes a polymer layer 114 positioned over second conductive layer 142. In one embodiment polymer layer 114 may be applied by now known or later developed techniques including spin-on or laminate techniques. Polymer layer 114 may include a photosensitive polymer such as benzocyclobutene (BCB) or any other suitable material. Polymer layer 114 includes a cavity 116. Cavity 116 may be formed by etching or by photolithographic processing (i.e., if polymer layer 114 is a photosensitive material). One embodiment of image sensor chip 102 includes a plurality of cavity components 118 (e.g., micro lenses and color filters 120 and sensor 122) in cavity 116 formed using conventional techniques. An optically transparent layer 124 may contact polymer layer 114 and covering cavity 116. Optically transparent layer 124 allows light to reach cavity components 118 while protecting cavity components 118. In one embodiment, optically transparent layer 124 may include glass.

Figure 5:
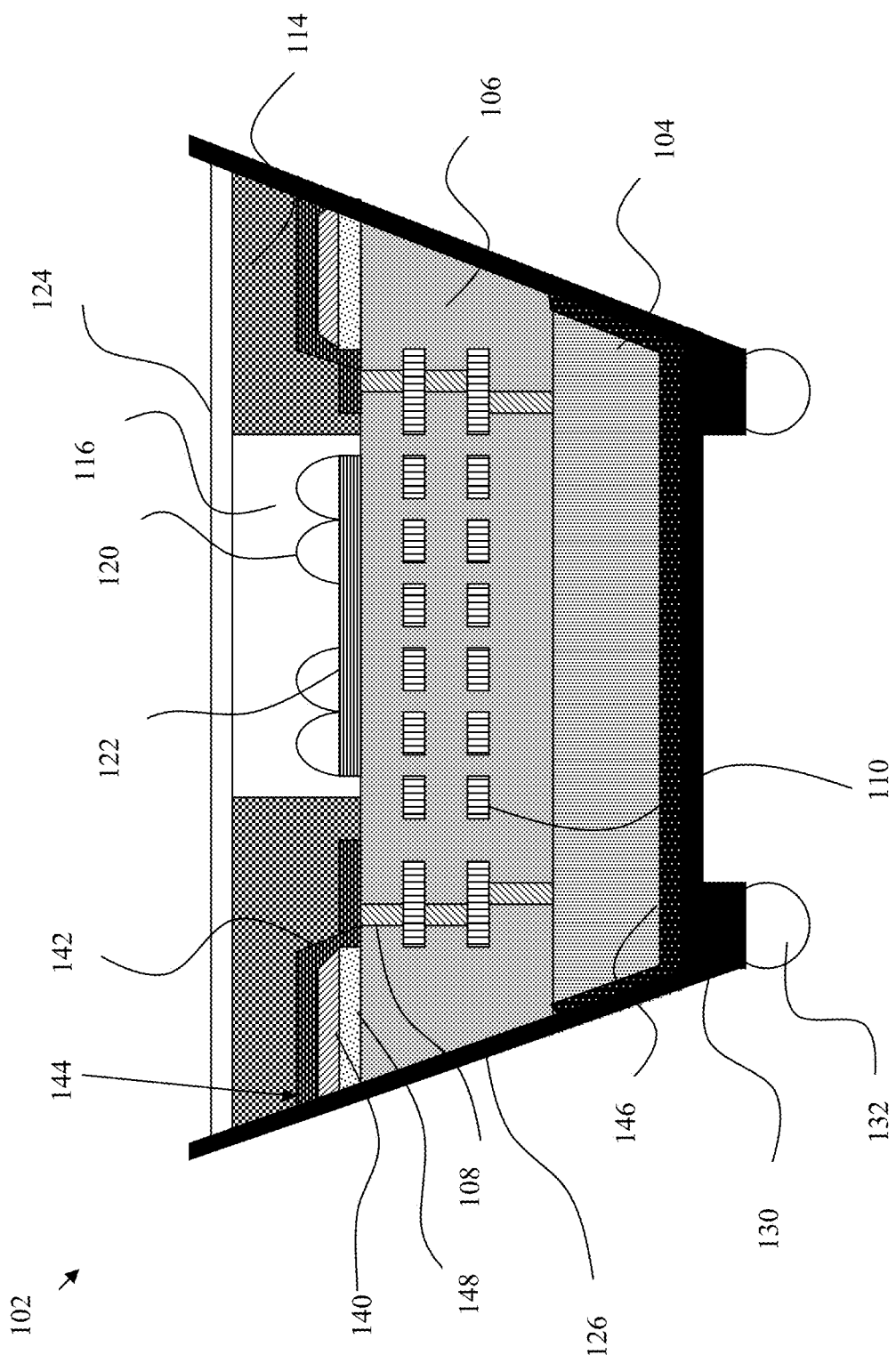
FIG. 5 shows a cross-section view of one embodiment of an image sensor chip after dicing according to the invention.

Referring to FIG. 5, a cross sectional view of one embodiment of an image sensor chip 102 after dicing in accordance with this invention is shown. First conductive layer 140 and second conductive layer 142 form a connection with a package lead 126. Together first conductive layer 140 and second conductive layer 142 form a thick bond pad 144. Thick bond pad 144 is described as thick in comparison to known image sensor chips 102 where bond pad 128 is of approximately the same thickness as conductive layer 112 of less than one (1.0) micron (see FIGS. 1 and 2). Package leads 126 run along the side of image sensor chip 102 to bump pads 130 and solder balls 132. The package leads 126 may be comprised of gold, copper, aluminum or any other suitable material. In an embodiment where substrate 104 is comprised of conducting or semiconducting material, package lead 126 may be isolated from substrate 104 by an insulator 146 such as silicon oxide ($SiO_2$), silicon nitride (SiN), or any other suitable material. Image sensor chip 2 may then be connected to a logic chip 36 and to a carrier package 38 using any now known or later developed technique.

Figure 6:
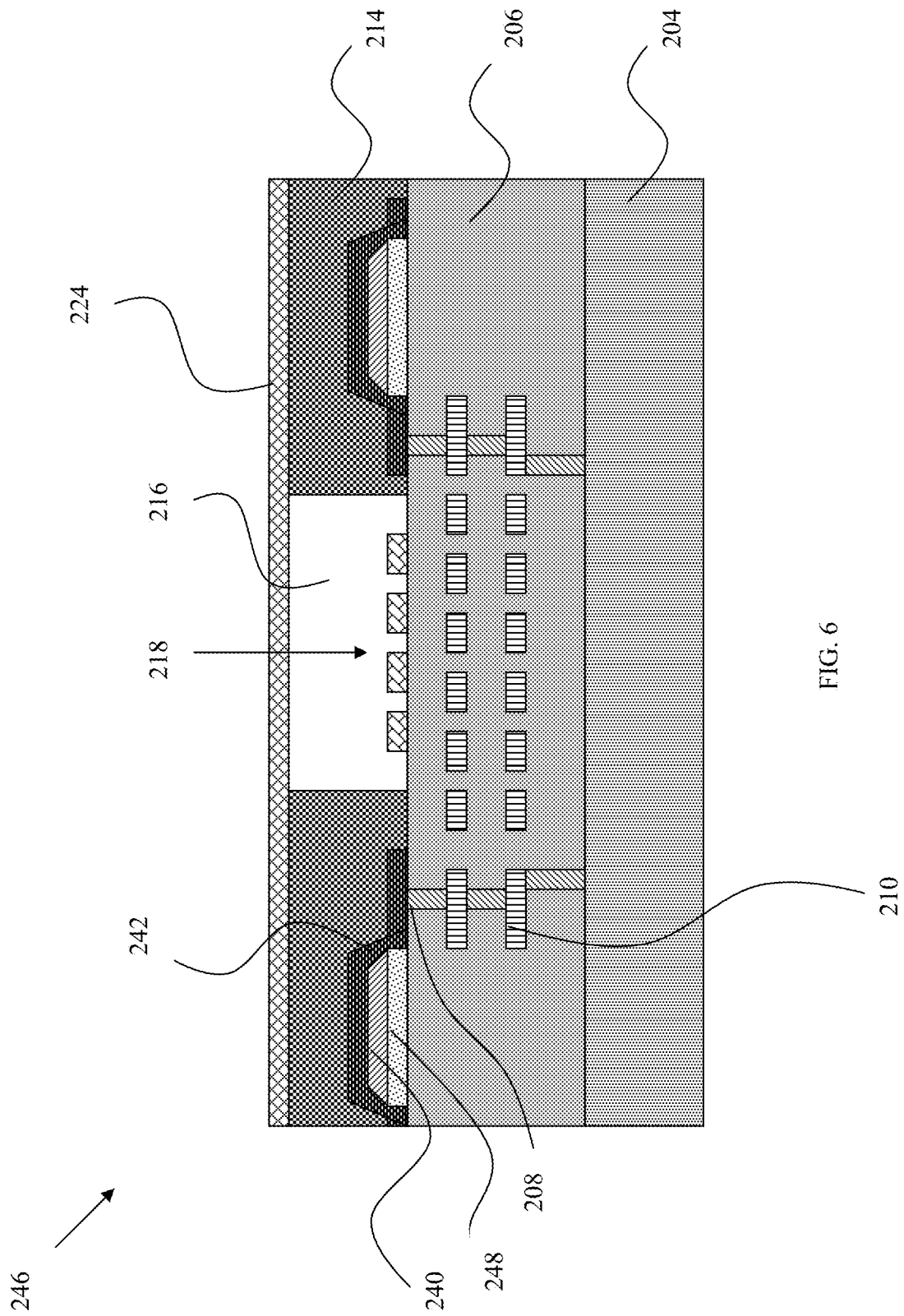
FIG. 6 shows a cross-section view of one embodiment of a chip with a cavity package after dicing according to the invention.

Referring to FIG. 6, a cross sectional view of one embodiment of a chip with a cavity package 246 in accordance with this invention is shown. This embodiment includes a substrate 204; an inter layer dielectric (ILD) 206 over substrate 204; at least one via 208 through ILD 206; a first conductive layer 240 over ILD 206, wherein first conductive layer 240 has a first thickness; a second conductive layer 222 over first conductive layer 240, wherein second conductive layer 242 has a second thickness of less than the first thickness; a polymer layer 214 over second conductive layer 242, and polymer layer 214 including a cavity 216. A person skilled in the art will readily recognize that cavity 216 could be used to hold cavity components 218. One embodiment may include a protective layer 224 placed over the polymer layer 214 and cavity 216. In one embodiment, protective layer 124 may allow other types of radiation such as x-rays or infrared radiation to reach cavity components 218 while substantially protecting cavity components 118.

Figure 7:
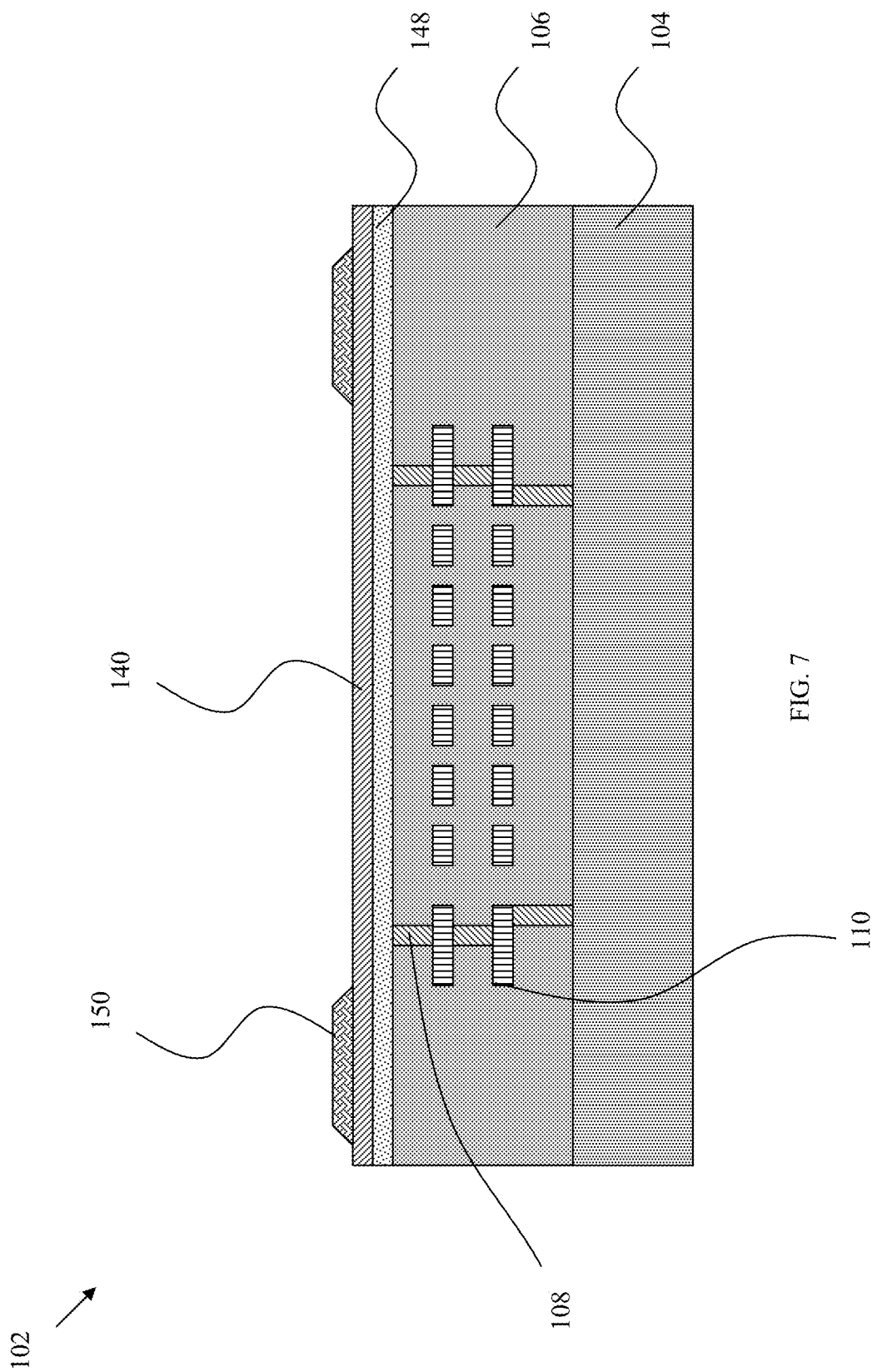
FIG. 7 shows a cross-section view of one embodiment of a step of forming an image sensor chip according to the invention.

Referring to FIG. 7, a cross-section view of one embodiment of a step of forming image sensor chip 102 before etching according to the invention is shown. Prior to this process, parts of image sensor chip 102 are formed on a substrate 104 including at least one inter layer dielectric (ILD) 106 deposited over substrate 104 and at least one via 108 through ILD 106 using any now known or later developed technique. A silicon nitride layer 148 is deposited over ILD 106. In one embodiment, silicon nitride layer 148 is deposited using PECVD. First conductive layer 140 having first thickness is deposited over silicon nitride layer 148. In one embodiment, silicon nitride layer 148 is deposited using CVD. In one embodiment, first conductive layer includes aluminum. First conductive layer may also include gold or copper. First thickness is approximately 1.0 microns or greater. A mask 150 may be formed over a portion of first conductive layer 140. Mask 150 may have a tapered profile or any other suitable shape. In FIG. 7, first conductive layer 140 is etched. First conductive layer 140 may be etched using any now known or later developed technique.

Figure 8:
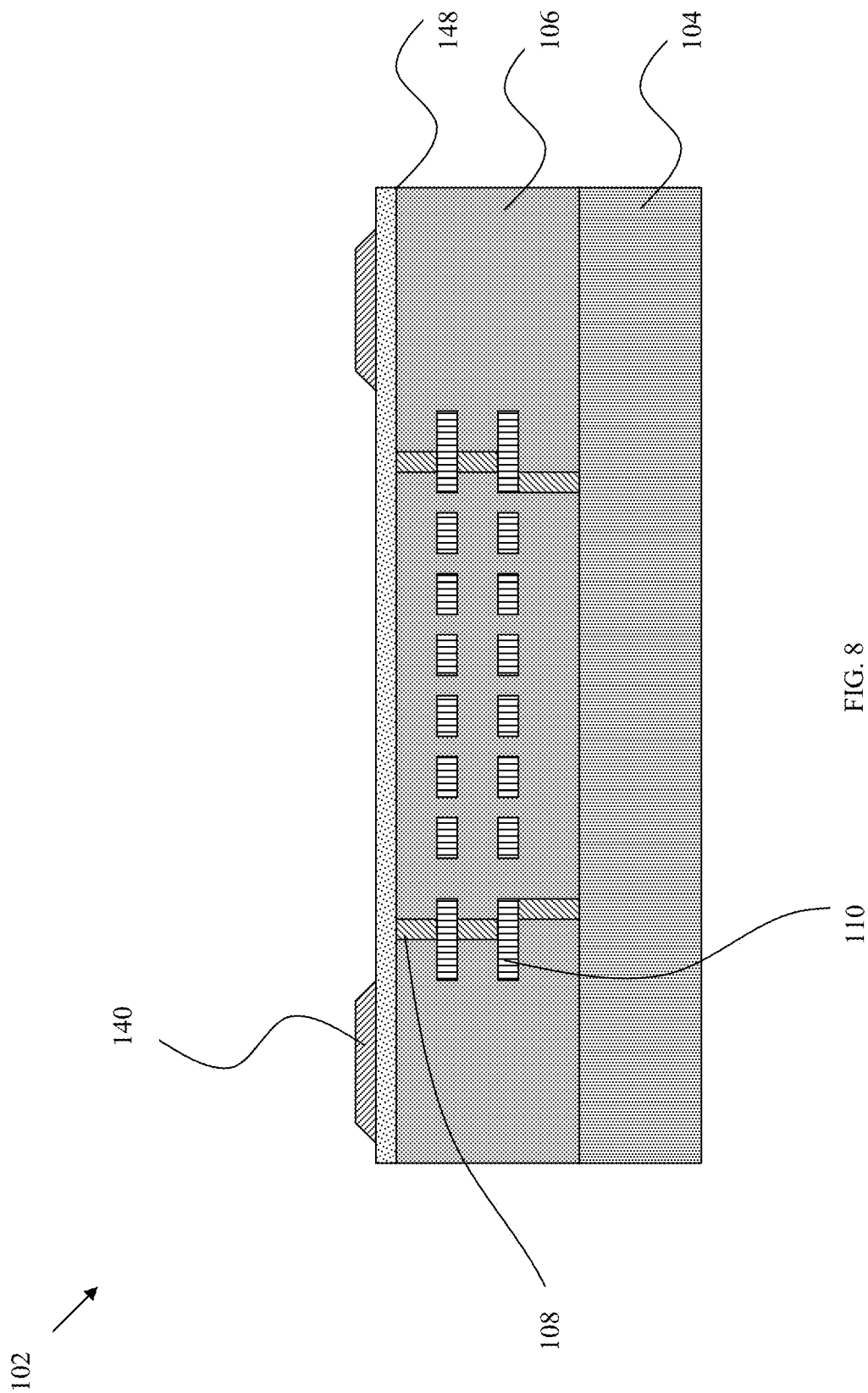
FIG. 8 shows a cross-section view of one embodiment of a step of forming an image sensor chip according to the invention.

In an embodiment that includes first conductive layer 140 comprised of aluminum, a chlorine-based etch may be used. Chlorine-based etch may include at least one of a reactive-ion etch and an isotropic etch. In an embodiment that includes first conductive layer 140 comprised of gold or copper, a mask may be used for etching. Mask 150 may be formed using an organic material (e.g., photoresist), a hardmask including an inorganic material (e.g., silicon oxide ($SiO_2$), silicon nitride (SiN), or any other suitable material), or any other now known or later developed technique. Referring to FIG. 8, a cross-section view of one embodiment of a step of forming an image sensor chip 102 after the etching of FIG. 7 according to the invention is shown. Here, first conductive layer 140 has been etched. Etching removes exposed portions of first conductive layer 140 leaving unexposed portions of first conductive layer 140 with a profile similar in the shape of mask 150 (FIG. 7). In this way, silicon nitride layer 148 remains substantially intact during and after the etching. Silicon nitride layer 148 substantially protects at least one via 108 from reacting with the etching.

In an embodiment that includes first conductive layer 140 comprised of gold or copper, a selective electroplating process may be used. Selective electroplating process may include any now known or later developed technique. For example, selective electroplating process may include depositing a seed layer (e.g., sputtered Ta/Cu). A resist pattern including openings may be formed over seed layer. First conductive layer 140 is deposited in openings of resist pattern. Resist pattern and seed layer are substantially removed using a wet or dry etch or any other suitable technique leaving first conductive layer 140.

Figure 9:
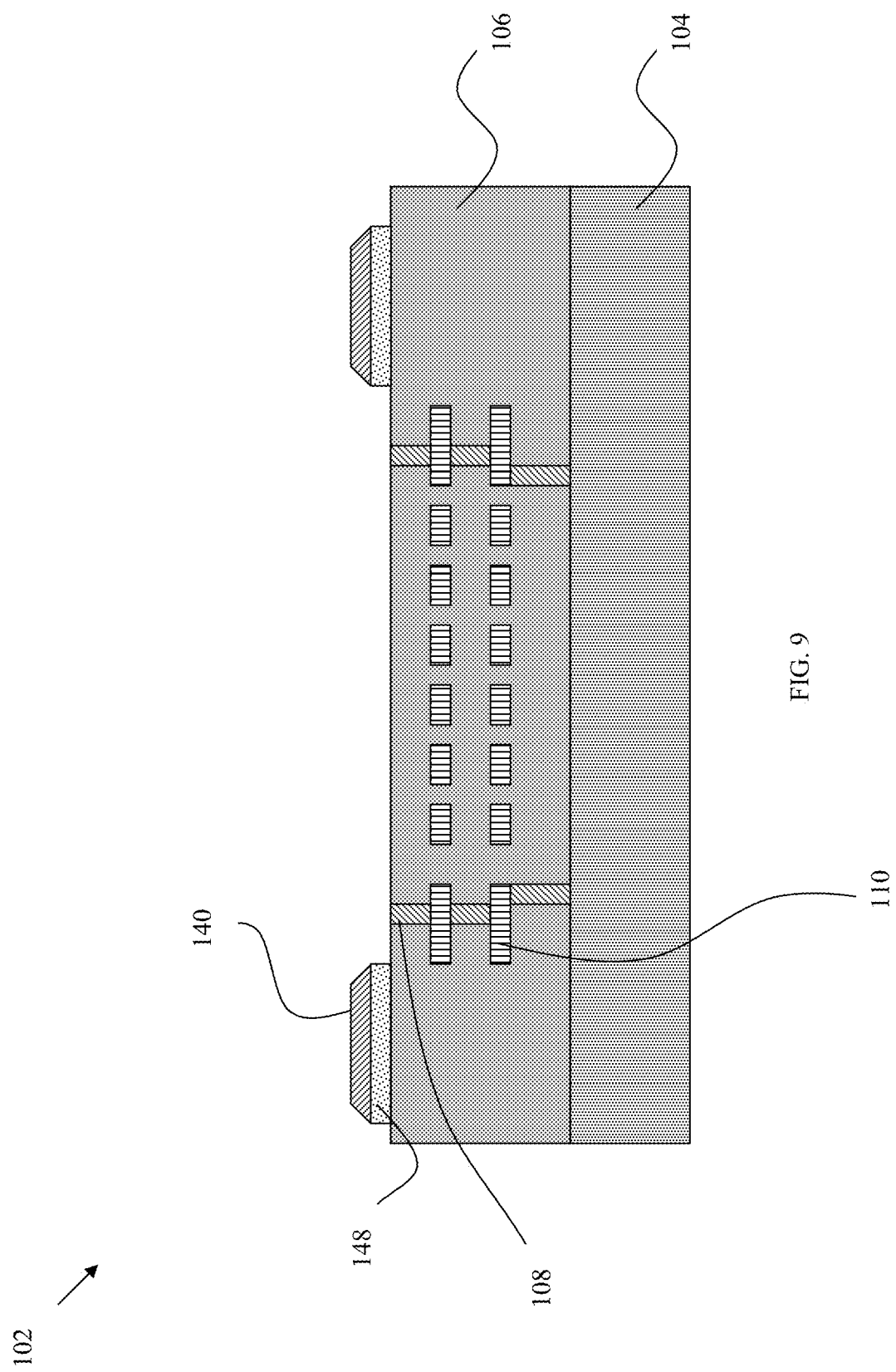
FIG. 9 shows a cross-section view of one embodiment of a step of forming an image sensor chip according to the invention.

Referring to FIG. 9, silicon nitride layer 148 is then etched with, e.g., a fluorine-based etch, substantially removing silicon nitride layer 148. Silicon nitride layer 148 may remain under first conductive layer 140. In this way, first conductive layer 140 and at least one via 108 remain intact.

Figure 10:
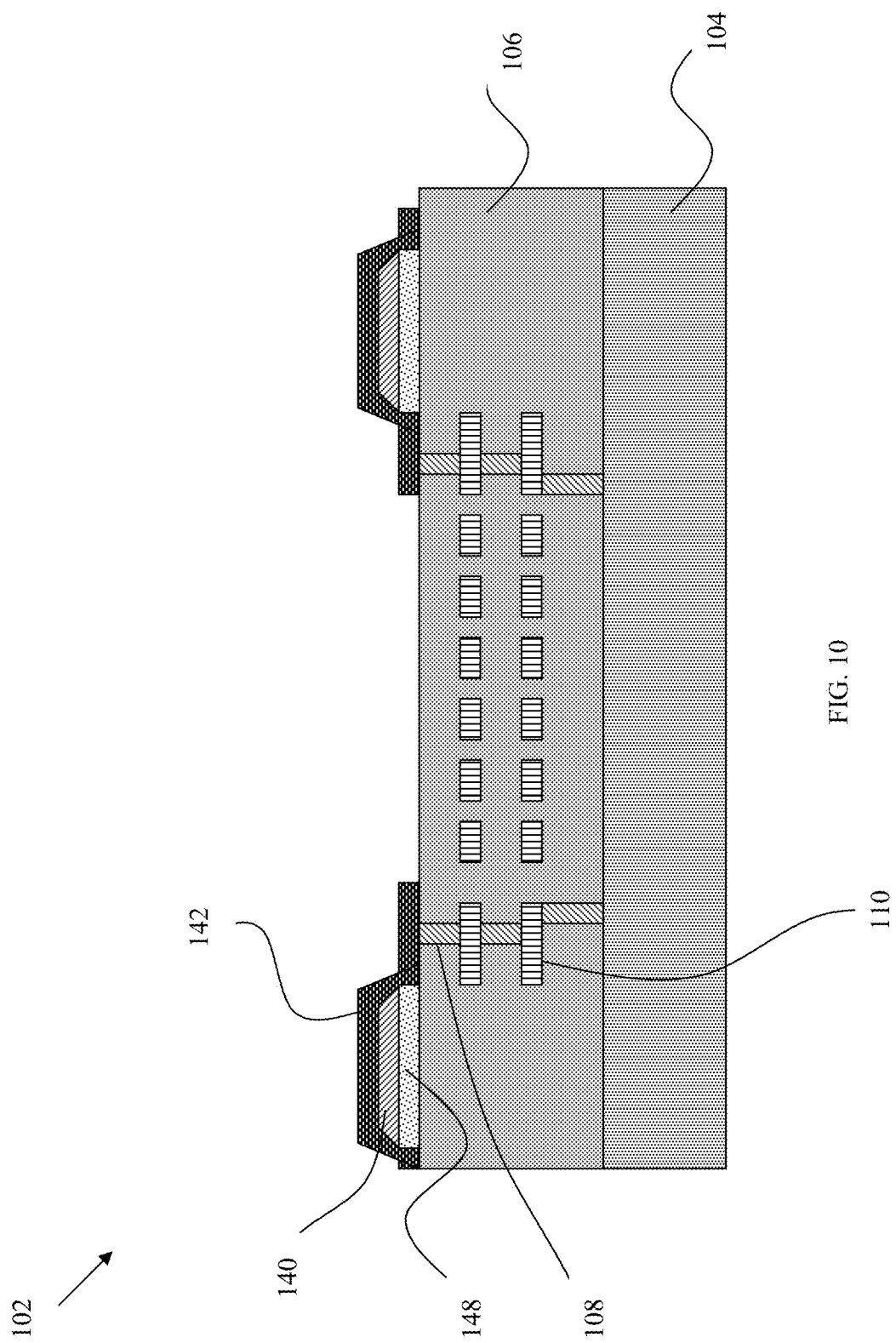
FIG. 10 shows a cross-section view of one embodiment of a step of forming an image sensor chip according to the invention.

Referring to FIG. 10, second conductive layer 142 having a second thickness is deposited and patterned over first conductive layer 140 and partially over ILD 106. Second thickness is less than approximately 1.0 microns. Second conductive layer 142 may be patterned using any now known or later developed techniques so as to form a connection with at least one via 108 and first conductive layer 140. Second conductive layer 142 may be etched to form a top wiring layer comprised of a plurality of wiring connections.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A chip with a cavity package, the chip comprising:
   a substrate having at least one via extending through at least one inter layer dielectric (ILD);
   a first conductive layer over the ILD, wherein the first conductive layer has a first thickness;
   a second conductive layer over the first conductive layer, wherein the second conductive layer has a second thickness of less than the first thickness, wherein an entire surface of the second conductive layer over the first conductive layer directly contacts the first conductive layer, and wherein the second conductive layer directly contacts the at least one via;
   a polymer layer over the second conductive layer, the polymer layer including a cavity; and
   a protective layer contacting the polymer layer and covering the cavity.

2. The chip of claim 1, wherein the first thickness is approximately 1.0 micron or greater.

3. The chip of claim 1, wherein the second thickness is approximately less than 1.0 micron.

4. The chip of claim 1, wherein the first conductive layer and the second conductive layer connect with a package lead.

5. The chip of claim 1, wherein the second conductive layer connects with the at least one via and the first conductive layer.

* * * * *